(12) United States Patent
Cha et al.

(10) Patent No.: US 12,701,840 B2
(45) Date of Patent: Aug. 4, 2026

(54) DISPLAY DEVICE AND METHOD OF MANUFACTURING THE SAME

(71) Applicant: Samsung Display Co., Ltd., Yongin-Si (KR)

(72) Inventors: Myounggeun Cha, Yongin-si (KR); Kiseok Choi, Yongin-si (KR); Dongkyun Seo, Yongin-si (KR); Heekyun Shin, Yongin-si (KR); Yong-Hoon Yang, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 402 days.

(21) Appl. No.: 18/244,305

(22) Filed: Sep. 11, 2023

(65) Prior Publication Data

US 2024/0162404 A1      May 16, 2024

(30) Foreign Application Priority Data

Nov. 16, 2022      (KR) ........................ 10-2022-0153765

(51) Int. Cl.
| | |
|---|---|
| *H10K 59/12* | (2023.01) |
| *H10H 20/857* | (2025.01) |
| *H10K 59/00* | (2023.01) |
| *H10W 90/00* | (2026.01) |
| *H10H 20/01* | (2025.01) |

(52) U.S. Cl.
CPC .......... *H10H 20/857* (2025.01); *H10W 90/00* (2026.01); *H10H 20/0364* (2025.01)

(58) Field of Classification Search
CPC ..... H10K 59/00; H10K 59/12; H10K 59/1201
See application file for complete search history.

(56) References Cited

U.S. PATENT DOCUMENTS

| | | | |
|---|---|---|---|
| 9,553,280 B2 | 1/2017 | Seo et al. | |
| 11,665,439 B2 | 5/2023 | Kim et al. | |
| 11,711,953 B2 | 7/2023 | Bok et al. | |
| 2023/0030952 A1* | 2/2023 | Ma ..................... | H10K 59/8791 |

FOREIGN PATENT DOCUMENTS

| | | |
|---|---|---|
| KR | 10-2017-0080343 A | 7/2017 |
| KR | 10-2313361 B1 | 10/2021 |
| KR | 10-2021-0148682 A | 12/2021 |
| KR | 10-2022-0031796 A | 3/2022 |

* cited by examiner

*Primary Examiner* — Joseph L Williams
(74) *Attorney, Agent, or Firm* — Innovation Counsel LLP

(57)      ABSTRACT

A display device is disclosed that includes a substrate, a display portion, a conductive layer, an inorganic layer, and an amorphous silicon layer. The substrate includes a first area including a transmission area and a non-transmission area adjacent to the transmission area, and a second area adjacent to the first area. The display portion is disposed in the non-transmission area and the second area on the substrate. The conductive layer is disposed between the substrate and the display portion, and overlaps the non-transmission area and the second area. The inorganic layer is disposed on the substrate under the conductive layer, in contact with the conductive layer, and overlaps the conductive layer. The amorphous silicon layer is disposed on the substrate, under the inorganic layer, in contact with the inorganic layer, overlaps the conductive layer in the first area, and entirely overlaps the substrate in the second area.

20 Claims, 12 Drawing Sheets

DISPLAY DEVICE AND METHOD OF MANUFACTURING THE SAME

CROSS-REFERENCE TO RELATED APPLICATION

This application claims priority to and benefits of Korean Patent Application No. 10-2022-0153765 under 35 U.S.C. § 119, filed on Nov. 16, 2022 in the Korean Intellectual Property Office (KIPO), the entire contents of which are hereby incorporated by reference.

BACKGROUND

1. Field

The present disclosure relates to a display device. More particularly, the present disclosure relates to a display device and a method of manufacturing the same.

2. Description of the Related Art

Display devices display images to provide visual information to users. Among display devices, organic light emitting diode displays have recently been attracting more attention.

When the display device includes a laminated structure of polyimide and an inorganic film, adhesive strength between the polyimide and the inorganic film may be relatively weak. As a result, a film lifting phenomenon may occur between the polyimide and the inorganic film, and thus the reliability of the display device may be deteriorated.

SUMMARY

Embodiments of the present disclosure may provide a display device with improved reliability.

Embodiments of the present disclosure may provide a method of manufacturing the display device.

A display device according to embodiments of the present disclosure includes a substrate including a first area including a transmission area and a non-transmission area adjacent to the transmission area, and a second area adjacent to the first area, a display portion disposed in the non-transmission area and the second area on the substrate, a conductive layer disposed between the substrate and the display portion, and overlapping the non-transmission area and the second area, an inorganic layer disposed on the substrate, disposed under the conductive layer, in contact with the conductive layer, and overlapping the conductive layer, and an amorphous silicon layer disposed on the substrate, disposed under the inorganic layer, in contact with the inorganic layer, overlapping the conductive layer in the first area, and entirely overlapping the substrate in the second area.

In an embodiment, the conductive layer may define a plurality of first openings overlapping the transmission area of the first area and a portion of the second area.

In an embodiment, the inorganic layer may define a plurality of second openings overlapping the plurality of first openings.

In an embodiment, the amorphous silicon layer may define a plurality of third openings overlapping the plurality of first openings in the first area.

In an embodiment, the amorphous silicon layer may entirely overlap the conductive layer and the plurality of first openings in the second area.

In an embodiment, the plurality of first openings and the plurality of second openings extend to the amorphous silicon layer in the second area and the second area does not include the plurality of third openings.

In an embodiment, the substrate may include transparent polyimide.

In an embodiment, the inorganic layer may include silicon oxide.

In an embodiment, the conductive layer may include a plurality of unit patterns arranged in a matrix form and a plurality of bridge patterns connecting the unit patterns.

In an embodiment, the display device may include a functional module disposed under the substrate corresponding to the transmission area of the first area.

In an embodiment, the display portion may include a light emitting element disposed on the conductive layer. The light emitting element may overlap the non-transmission area and the second area, and may be spaced apart from the transmission area.

A method of manufacturing a display device according to embodiments of the present disclosure, the method includes providing a substrate including a first area including a transmission area and a non-transmission area adjacent to the transmission area, and a second area adjacent to the first area, forming a preliminary amorphous silicon layer on the substrate, forming a preliminary inorganic layer on the preliminary amorphous silicon layer, forming a preliminary conductive layer on the preliminary inorganic layer, forming a conductive layer overlapping the non-transmission area and the second area by patterning the preliminary conductive layer, forming an inorganic layer overlapping the conductive layer by patterning preliminary inorganic layer, and forming an amorphous silicon layer overlapping the conductive layer in the first area and entirely overlapping the substrate in the second area by pattering the preliminary amorphous silicon layer.

In an embodiment, the method may further include forming a photoresist layer on the preliminary conductive layer, forming a first photoresist pattern by patterning the photoresist layer, and forming a second photoresist pattern by etch-backing the first photoresist pattern.

In an embodiment, the first photoresist pattern may be formed using a halftone mask.

In an embodiment, the first photoresist pattern may overlap the non-transmission area of the first area and the second area.

In an embodiment, each of the preliminary conductive layer, the preliminary inorganic layer, and the preliminary amorphous silicon layer may be etched using the first photoresist pattern to form an intermediate conductive layer, an intermediate inorganic layer, and the amorphous silicon layer.

In an embodiment, the second photoresist pattern may include a plurality of openings overlapping the transparent area of the first area and a portion of the second area.

In an embodiment, each of the intermediate conductive layer and the intermediate inorganic layer may be etched using the second photoresist pattern to form the conductive layer and the inorganic layer.

In an embodiment, a plurality of first openings overlapping the plurality of openings may be formed in the conductive layer and a plurality of second openings overlapping the plurality of openings may be formed in the inorganic layer.

In an embodiment, the plurality of first openings and the plurality of second openings may expose the amorphous silicon layer in the second area.

In a display device according to embodiments, an inorganic layer and an amorphous silicon layer may be disposed under a conductive layer, and the amorphous silicon layer may overlap only a transmission area in a first area and entirely overlap a substrate in a second area. Accordingly, to prevent a user from seeing a ghost image or the like may be possible, and an adhesive strength between a display portion and the substrate may be improved. That is, since the amorphous silicon layer overlaps only the transmission area in the first region, the transmittance of the first area may be maintained, and the adhesive strength between the display portion and the substrate in the second area may be improved by being entirely disposed in the second area. Accordingly, the transmittance of the first area of the display device may be maintained and the functionality of the functional module of the display device may be improved. In addition, film lifting defect in the second area through the amorphous silicon layer may be reduced, thereby improving reliability of the display device.

In a method of manufacturing the display device according to embodiments of the present disclosure, since a first photoresist pattern is formed using a halftone mask, the display device having different structures in the first area and the second area may be formed using only one photo process. Therefore, since an additional process is not required, efficiency in the manufacturing process of the display device may be improved.

BRIEF DESCRIPTION OF THE DRAWINGS

Illustrative, non-limiting embodiments will be more clearly understood from the following detailed description in conjunction with the accompanying drawings.

FIG. 3 is a plan view illustrating an example of a first area included in the display device of FIG. 1 according to an embodiment.

FIG. 7 is a cross-sectional view illustrating another example of FIG. 4.

DETAILED DESCRIPTION OF THE EMBODIMENTS

Figure 1:
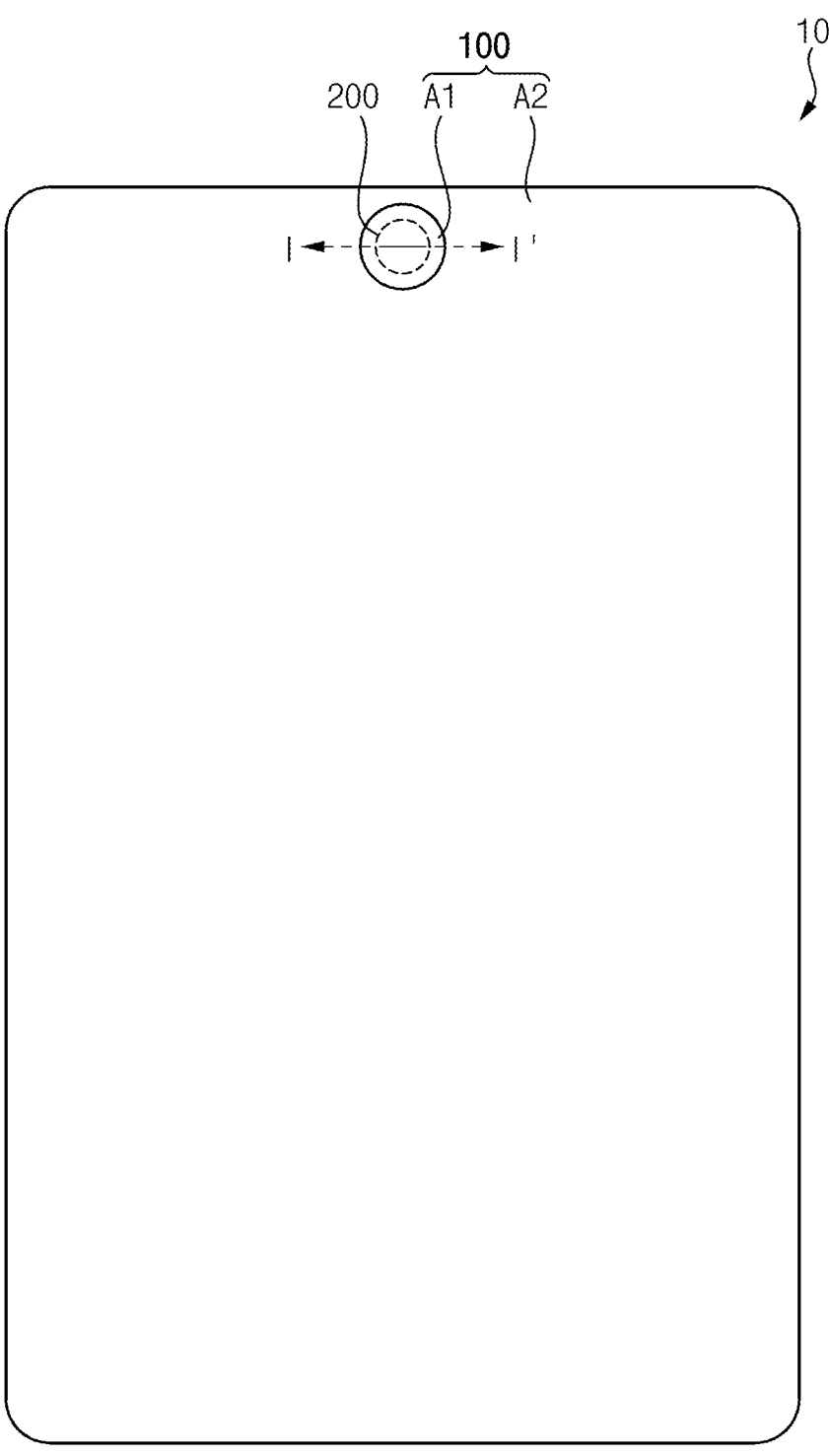
FIG. 1 is a plan view illustrating a portion of a display device according to an embodiment of the present disclosure.

Hereinafter, a display device according to embodiments of the present disclosure will be explained in detail with reference to the accompanying drawings. The same reference numerals are used for the same components in the drawings, and redundant descriptions of the same components will be omitted.

Figure 2:
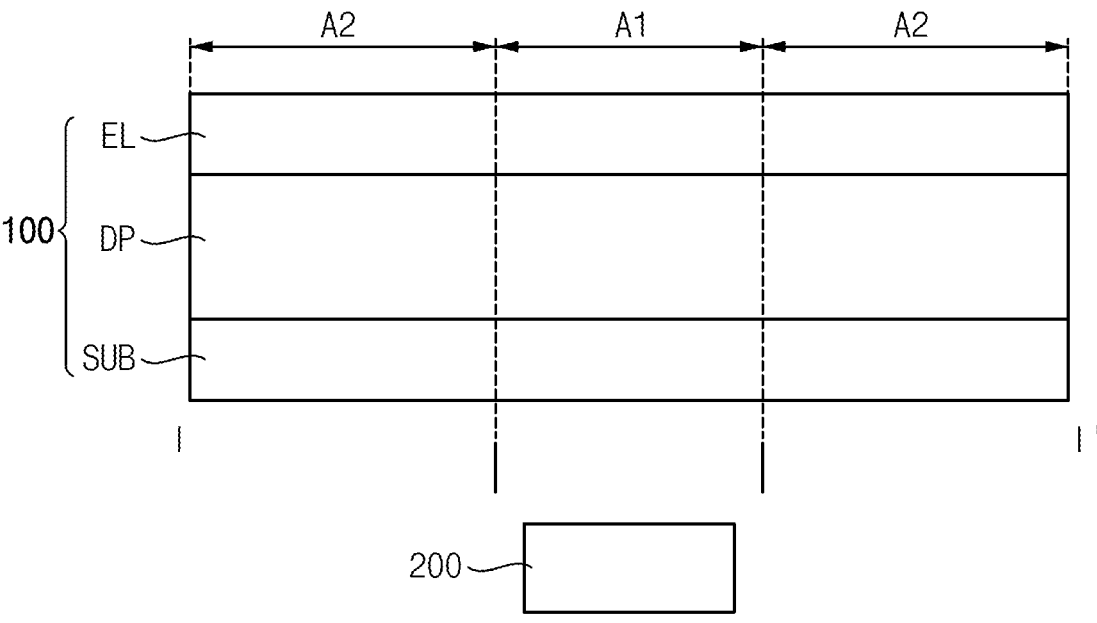
FIG. 2 is a cross-sectional view illustrating an example cut along line I-I' of FIG. 1.

FIG. 1 is a plan view illustrating a portion of a display device according to an embodiment of the present disclosure. FIG. 2 is a cross-sectional view illustrating an example cut along line I-I' of FIG. 1.

Referring to FIGS. 1 and 2, the display device 10 may include a display panel 100 and a functional module 200.

The display panel 100 may include a first area A1 and a second area A2. Each of the first area A1 and the second area A2 may be a display area for displaying an image. The first area A1 may include a transmission area that transmits external light and a non-transmission area surrounding the transmission area. The first area A1 may transmit external light incident on the first area A1 while displaying an image.

The first area A1 and the second area A2 may be adjacent to each other. In an embodiment, the second area A2 may surround at least a portion of the first area A1. For example, the first area A1 is disposed within the display panel 100 while being spaced apart from an edge of the display panel 100 in a plan view, and the second area A2 may surround entirely of the first area A1.

In an embodiment, the first area A1 may have a circular planar shape. However, the present disclosure is not limited thereto, and the first area A1 may have various polygonal planar shapes.

The functional module 200 may be disposed under the display panel 100 corresponding to the first area A1. The functional module 200 may receive external light passing through the first area A1.

In an embodiment, examples of the functional module 200 may include a camera module, a face recognition sensor module, a pupil recognition sensor module, an acceleration sensor module, a proximity sensor module, an infrared sensor module, and an illuminance sensor module. The camera module may be a module that captures (or recognizes) an image of an object located in front of the display device 10. The face recognition sensor module may be a module that detects a user's face. The pupil recognition sensor module may be a module that detects the pupil of the user. The acceleration sensor module and the geomagnetic sensor module may be modules that determine the movement of the display device 10. The proximity sensor module and the infrared sensor module may be modules that detect proximity of the front of the display device. The illuminance sensor module may be a module that measures the degree of external brightness.

Figure 3:
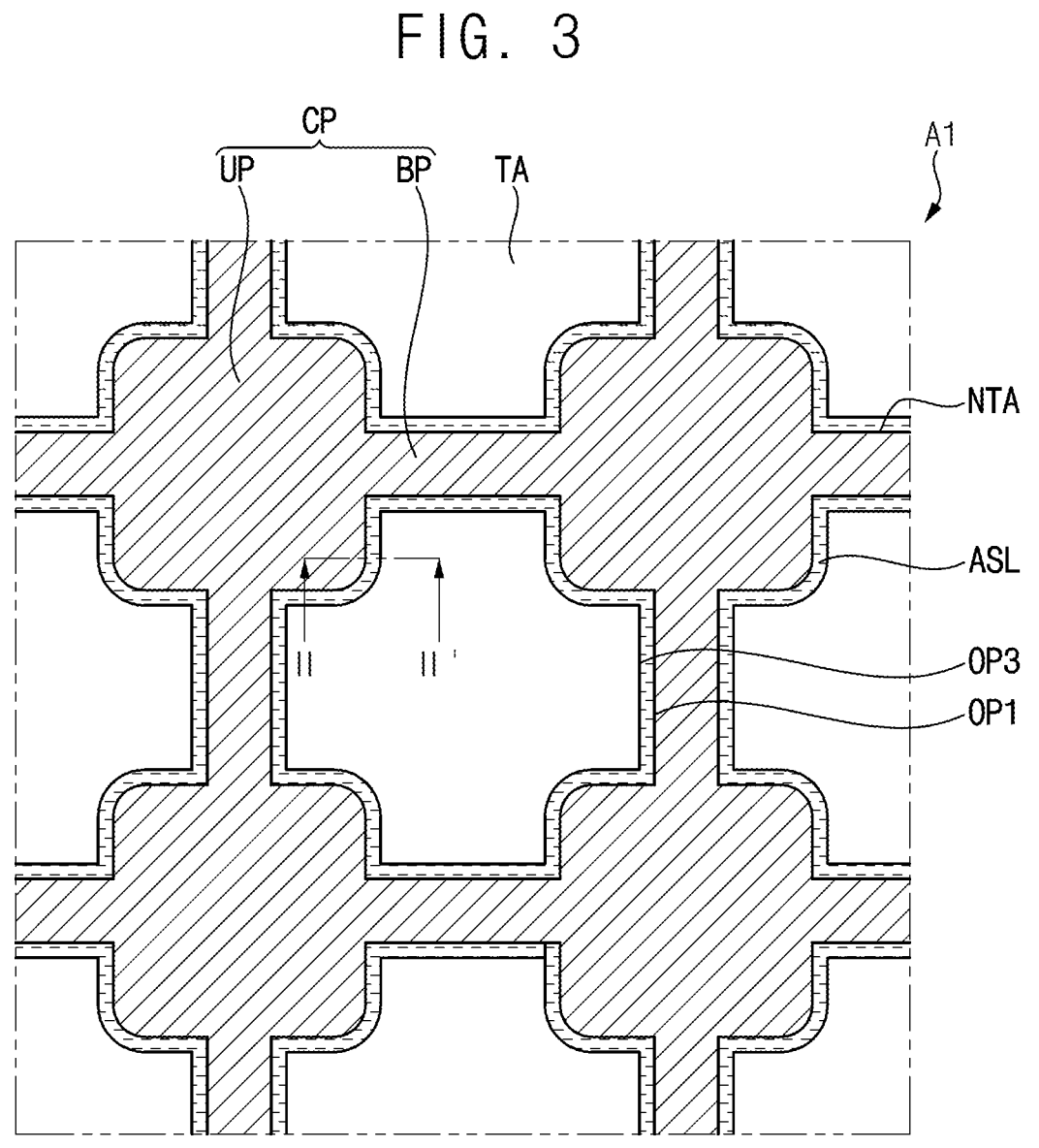
Figure 4:
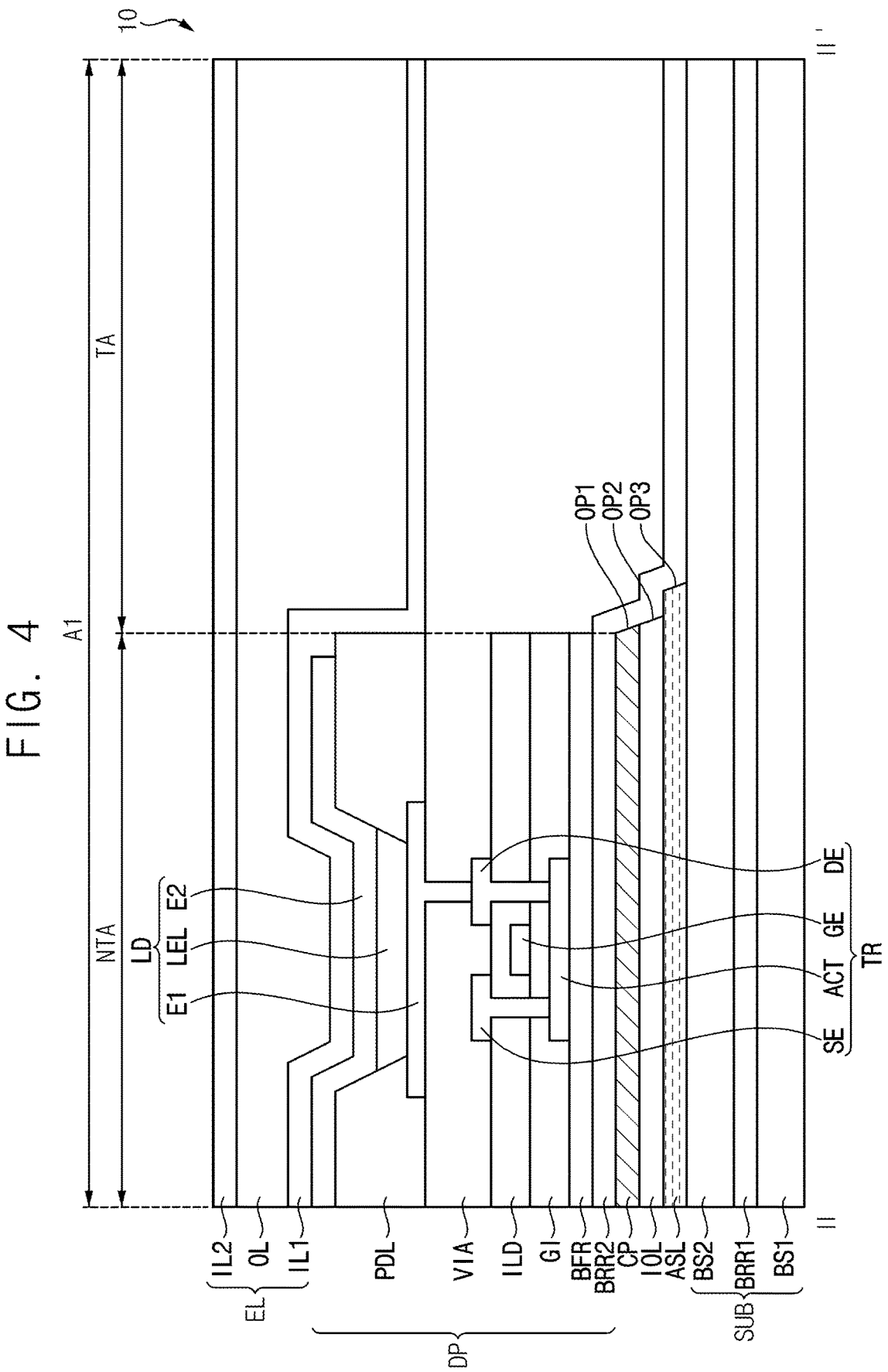
FIG. 4 is a cross-sectional view taken along line II-IP of FIG. 3.

FIG. 3 is a plan view illustrating an example of a first area included in the display device of FIG. 1 according to an embodiment. FIG. 4 is a cross-sectional view taken along line II-IP of FIG. 3.

Referring to FIGS. 3 and 4, the display panel 100 may include a substrate SUB, a display portion DP, an encapsulation layer EL, a conductive layer CP, an inorganic layer IOL, and an amorphous silicon layer ASL. As the display panel 100 includes the first area A1 and the second area A2, the substrate SUB may also include the first area A1 and the second area A2.

The first area A1 may include a transmission area TA and a non-transmission area NTA. The non-transmission area NTA may be adjacent to the transmission area TA. For example, the transmission area TA may be an area where the conductive layer CP is not disposed, and the non-transmission area NTA may be an area where the conductive layer CP is disposed. Accordingly, the transmission area TA and the non-transmission area NTA may have a different arrangement relationship and area depending on the shape of the conductive layer CP.

The transmission area TA may be an area through which external light incident on the display device 10 is transmitted. Since the first area A1 includes the transmission area TA through which external light passes, the functional module 200 disposed under the display panel 100 corresponding to the first area A1 may detect or recognize an object or user located in front of the display device 10 through the transmission area TA.

The non-transmission area NTA may be an area where light generated from the display portion DP is emitted. The display unit DP may include a plurality of pixels. In addition, the pixels may include a plurality of sub-pixels emitting light of different colors. For example, the sub-pixels may include a red sub-pixel that emits red light, a green sub-pixel that emits green light, and a blue sub-pixel that emits blue light. For example, the sub-pixels may be arranged in a stripe method or in a Pentile™ method.

Since the first area A1 includes the transmission area TA, the number of sub-pixels per unit area of the first area A1 may be smaller than the number of sub-pixels per unit area of the second area A2. In other words, the resolution of the first area A1 may be smaller than the resolution of the second area A2.

In an embodiment, since the first area A1 includes the transmission area TA, the transmittance of the first area A1 may be higher than the transmittance of the second area A2. In other words, the transmittance of the second area A2 may be lower than the transmittance of the first area A1.

The substrate SUB may be an insulating substrate formed of a transparent or opaque material. The substrate SUB may have a single-layer or multi-layer structure. In an embodiment, the substrate SUB may include plastic. In this case, the substrate SUB may be a flexible substrate. In another embodiment, the substrate SUB may include glass. In this case, the substrate SUB may be a rigid substrate.

In an embodiment, the substrate SUB may include a first base substrate BS1, a first barrier layer BRR1, and a second base substrate BS2.

Specifically, the first barrier layer BRR1 may be disposed on the first base substrate BS1. The second base substrate BS2 may be disposed on the first barrier layer BRR1.

The first base substrate BS1, the first barrier layer BRR1, and the second base substrate BS2 may prevent permeation of external moisture. The substrate SUB may be configured as a double layer including the first base substrate BS1 and the second base substrate BS2 in order to delay the water permeation time.

In an embodiment, each of the first base substrate BS1 and the second base substrate BS2 may include a transparent material. The first base substrate BS1 and the second base substrate BS2 may include polyimide. For example, the first base substrate BS1 and the second base substrate BS2 may include transparent polyimide. In addition, the first barrier layer BRR1 may include a double layer. Examples of the material constituting the first barrier layer BRR1 may include silicon oxide, silicon nitride, silicon oxynitride, and the like. These materials may be used alone or in combination. However, the present disclosure is not limited thereto.

The display portion DP may be disposed on the substrate SUB. The display portion DP may include pixels for displaying an image. Each of the pixels may include a transistor TR and a light emitting element LD connected to the transistor TR.

The conductive layer CP may be disposed between the substrate SUB and the display part DP. The conductive layer CP may block external light incident from the outside of the display device 10. The conductive layer CP may include a conductive material. For example, examples of the conductive material constituting the conductive layer CP may include aluminum, platinum, palladium, silver, magnesium, gold, nickel, neodymium, iridium, chromium, lithium, calcium, molybdenum, titanium, tungsten, copper, and the like.

These materials may be used alone or in combination. Preferably, the conductive layer CP may include molybdenum ("Mo").

The inorganic layer IOL may be disposed between the substrate SUB and the conductive layer CP. The inorganic layer IOL may prevent external light from reaching the conductive layer CP. The inorganic layer IOL may include an inorganic material. For example, the inorganic layer IOL may include silicon oxide, silicon nitride, silicon oxynitride, and the like. These materials may be used alone or in combination. Preferably, the inorganic layer IOL may include silicon oxide. However, the present disclosure is not limited thereto.

The amorphous silicon layer ASL may be disposed between the substrate SUB and the inorganic layer IOL. The amorphous silicon layer ASL may include amorphous silicon.

In an embodiment, in the first area A1, the conductive layer CP may overlap the non-transmission area NTA of the first area A1 and does not overlap the transmission area TA.

In the first area A1, the inorganic layer IOL may be disposed under the conductive layer CP and may contact the conductive layer CP. In addition, the inorganic layer IOL may overlap the non-transmission area NTA, and thus, the inorganic layer IOL may overlap the conductive layer CP.

In the first area A1, the amorphous silicon layer ASL may be disposed under the inorganic layer IOL and may contact the inorganic layer IOL. In addition, the amorphous silicon layer ASL may overlap the non-transmission area NTA, and thus, the amorphous silicon layer ASL may overlap the conductive layer CP and the inorganic layer IOL.

In an embodiment, the conductive layer CP may include a plurality of unit patterns UP and a plurality of bridge patterns BP connecting the unit patterns UP. The plurality of unit patterns UP may be arranged in various ways. For example, the plurality of unit patterns UP may be arranged in a matrix form.

In an embodiment, the conductive layer CP may define first openings OP1. For example, the first openings OP1 may be defined by the unit patterns UP and the bridge patterns BP. The first openings OP1 may overlap the transmission area TA.

When the first openings OP1 are defined in the conductive layer CP, the transmission area TA may be defined. That is, external light may pass through the transmission area TA due to the first openings OP1.

The inorganic layer IOL may define a plurality of second openings OP2. The plurality of second openings OP2 may overlap the plurality of first openings OP1. Accordingly, the plurality of second openings OP2 may overlap the transmission area TA. The shape of the inorganic layer IOL may be substantially the same as the shape of the conductive layer CP. However, the present disclosure may not be limited thereto. Accordingly, the inorganic layer IOL may also include a plurality of unit patterns and a plurality of bridge patterns connecting the unit patterns.

The second openings OP2 may be defined by the unit patterns and the bridge patterns included in the inorganic layer IOL. The second openings OP2 may overlap each of the first openings OP1 and may have the same shape as the first openings OP1.

In an embodiment, in the first area A1, the amorphous silicon layer ASL may define a plurality of third openings OP3. The plurality of third openings OP3 may overlap the plurality of first openings OP1. In the first area A1, the shape of the amorphous silicon layer ASL may be substantially the same as the shape of the conductive layer CP. However, the present disclosure is not limited thereto. Accordingly, the amorphous silicon layer ASL may also include a plurality of unit patterns and a plurality of bridge patterns connecting the unit patterns.

The third openings OP3 may be defined by the unit patterns and the bridge patterns included in the amorphous silicon layer ASL. The third openings OP3 may overlap each of the first openings OP1 and may have a shape similar to a shape of the first openings OP1. The third openings OP3 may overlap the transmission area TA.

An area of each of the plurality of third openings OP3 may be smaller than an area of each of the plurality of first openings OP1. That is, in the first area A1, the area of the amorphous silicon layer ASL may be greater than the area of the conductive layer CP. However, the present disclosure is not limited thereto, and the area of each of the plurality of third openings OP3 may be substantially the same as the area of each of the plurality of first openings OP1.

Light interference may occur when external light passes through the first area A1, and when the external light is reflected by the display panel 100 and/or the functional module 200, a user may view a ghost image or the like displayed in the first area A1. However, since the display device 10 according to an embodiment of the present disclosure includes the inorganic layer IOL and the amorphous silicon layer ASL disposed in the first region A1 and overlapping the conductive layer CP, even if the external light is reflected by the functional module 200, re-reflection of the external light by the conductive layer CP may be prevented. That is, the inorganic layer IOL and the amorphous silicon layer ASL may block the external light reaching the conductive layer CP. Accordingly, this may prevent a user from viewing a ghost image or the like.

The display portion DP may be disposed on the conductive layer CP. The display portion DP may be disposed in the non-transmission area NTA.

The display portion DP may include a second barrier layer BRR2, a buffer layer BFR, a gate insulating layer GI, an interlayer insulating layer ILD, the transistor TR, a via insulating layer VIA, a pixel defining layer PDL, and the light emitting element LD. The transistor TR may include an active layer ACT, a source electrode SE, a gate electrode GE, and a drain electrode DE. The light emitting element LD may include a first electrode E1, a light emitting layer LEL, and a second electrode E2.

The second barrier layer BRR2 may be disposed on the conductive layer CP. The second barrier layer BRR2 may prevent foreign substances from penetrating into a lower portion of the substrate SUB. The second barrier layer BRR2 may include a double layer. Examples of the material constituting the second barrier layer BRR2 may include silicon oxide, silicon nitride, silicon oxynitride, and the like. These materials may be used alone or in combination.

In the non-transmission area NTA, the buffer layer BFR may be disposed on the second barrier layer BRR2. The buffer layer BFR may prevent penetration of foreign substances through the conductive layer CP. Examples of the material constituting the buffer layer BFR may include silicon oxide, silicon nitride, silicon oxynitride, and the like. These materials may be used alone or in combination.

In the non-transmission area NTA, the active layer ACT may be disposed on the buffer layer BFR. The active layer ACT may include a semiconductor material. For example, the active layer ACT may include a silicon-based semiconductor material. Alternatively, the active layer ACT may include an oxide-based semiconductor material.

In the non-transmission area NTA, the gate insulating layer GI may be disposed on the buffer layer BFR. The gate insulating layer GI may cover the active layer ACT. The gate insulating layer GI may insulate the active layer ACT from the gate electrode GE. The gate insulating layer GI may include an inorganic insulating material. For example, the gate insulating layer GI may include silicon oxide, silicon nitride, silicon oxynitride, and the like.

In the non-transmission area NTA, the gate electrode GE may be disposed on the gate insulating layer GI. The gate electrode GE may be disposed to overlap the active layer ACT. The gate electrode GE may include a conductive material. For example, examples of the conductive material constituting the gate electrode GE may include aluminum, platinum, palladium, silver, magnesium, gold, nickel, neodymium, iridium, chromium, lithium, calcium, molybdenum, titanium, tungsten, copper, and the like. These materials may be used alone or in combination. When an electrical signal is applied to the gate electrode GE, the source electrode SE and the drain electrode DE may be electrically connected.

In the non-transmission area NTA, the interlayer insulating layer ILD may be disposed on the gate insulating layer GI. The interlayer insulating layer ILD may cover the gate electrode GE. The interlayer insulating layer ILD may insulate the gate electrode GE and the source electrode SE. In addition, the interlayer insulating layer ILD may insulate the gate electrode GE and the drain electrode DE. The interlayer insulating layer ILD may include an inorganic insulating material. For example, examples of the inorganic insulating material constituting the interlayer insulating layer ILD include silicon oxide, silicon nitride, silicon oxynitride, and the like. These materials may be used alone or in combination.

In the non-transmission area NTA, the source electrode SE and the drain electrode DE may be disposed on the interlayer insulating layer ILD. The source electrode SE and the drain electrode DE may contact the active layer ACT. For example, the source electrode SE may contact one side of the active layer ACT through a through hole penetrating the interlayer insulating layer ILD and the gate insulating layer GI. For example, the drain electrode DE may contact the other side of the active layer ACT through a through hole penetrating the interlayer insulating layer ILD and the gate insulating layer GI. Each of the source electrode SE and the drain electrode DE may include a conductive material. For example, examples of the conductive material constituting the source electrode SE and the drain electrode DE may include aluminum, platinum, palladium, silver, magnesium, gold, nickel, neodymium, iridium, chromium, lithium, calcium, molybdenum, titanium, tungsten, copper, and the like. These materials may be used alone or in combination.

The via insulating layer VIA may be disposed in the non-transmission area NTA and the transmission area TA. Specifically, in the non-transmission area NTA, the via insulating layer VIA may be disposed on the interlayer insulation layer ILD. In the transmission area TA, the via insulation layer VIA may be disposed on the second barrier layer BRR2. That is, the via insulating layer VIA may be disposed in the non-transmission area NTA and the transmission area TA. However, embodiments according to the present disclosure are not limited thereto, and the via insulating layer VIA may be disposed only in the non-transmission area NTA. In addition, although the via insulating layer VIA is shown as a single layer in the drawings, it is not limited thereto, and the via insulating layer VIA may have multiple layers.

The via insulating layer VIA may cover the source electrode SE and the drain electrode DE. The via insulating layer VIA may cover side surfaces of the inorganic layer IOL, the conductive layer CP, the buffer layer BFR, the gate insulating layer GI, and the interlayer insulating layer ILD. The via insulating layer VIA may have a flat upper surface. The via insulating layer VIA may include an organic insulating material. For example, examples of the organic insulating material constituting the via insulating layer VIA may include acrylic, benzocyclobutene ("BCB"), hexamethyldisiloxane ("HMDSO"), and the like. These materials may be used alone or in combination.

In the non-transmission area NTA, the first electrode E1 may be disposed on the via insulating layer VIA. The first electrode E1 may be electrically connected to the drain electrode DE. For example, the first electrode E1 may contact one side of the drain electrode DE through a through hole penetrating the via insulation layer VIA. The first electrode E1 may include a conductive material. For example, examples of the conductive material constituting the first electrode E1 may include ITO, IZO, IGO, AZO, IGZO, and the like. These materials may be used alone or in combination. Alternatively, the first electrode E1 may include the same material as the gate electrode GE.

In the non-transmission area NTA, the pixel defining layer PDL may be disposed on the via insulation layer VIA. The pixel defining layer PDL may cover at least a portion of the first electrode E1. The pixel defining layer PDL may include an opening exposing at least a portion of the first electrode E1.

In the non-transmission area NTA, the light emitting layer LEL may be disposed on the first electrode E1. The light emitting layer LEL may include a hole injection layer, a hole transport layer, an organic light emitting layer, an electron injection layer, and an electron transport layer. The light emitting layer LEL may emit light. Alternatively, the light emitting layer LEL may include an inorganic light that emits material.

In the non-transmission area NTA, the second electrode E2 may be disposed on the pixel defining layer PDL. The second electrode E2 may be disposed to cover the light emitting layer LEL. The second electrode E2 may include a metal having a relatively low work function. For example, examples of forming the second electrode E2 include lithium, calcium, aluminum, silver, magnesium, and the like. These materials may be used alone or in combination.

In the non-transmission area NTA, the active layer ACT, the gate electrode GE, the source electrode SE, and the drain electrode DE may define the transistor TR. In the non-transmission area NTA, the first electrode E1, the light emitting layer LEL, and the second electrode E2 may define the light emitting element LD. The light emitting layer LEL may be electrically connected to the transistor TR. Accordingly, the light emitting layer LEL may receive an electrical signal from the transistor TR and emit light having a luminance corresponding to the intensity of the electrical signal.

The transistor TR and the light emitting element LD may overlap only the non-transmission area NTA. The transistor TR and the light emitting element LD may be spaced apart from the transmission area TA. That is, the transistor TR and the light emitting element LD may not overlap the transmission area TA. Accordingly, the transmission area TA may transmit light and the non-transmission area NTA may emit light. As such, since the first area A1 includes the transmission area TA and the non-transmission area NTA, the first area A1 may have a relatively high transmittance compared to the second area A2.

The encapsulation layer EL may be disposed on the display portion DP. The encapsulation layer EL may include a first inorganic encapsulation layer ILL an organic encapsulation layer OL, and a second inorganic encapsulation layer IL2.

The first inorganic encapsulation layer IL1 may be disposed in the non-transmission area NTA and the transmission area TA. Specifically, the first inorganic encapsulation layer IL1 may be disposed on the second electrode PE2 in the non-transmission area NTA. In the transmission area TA, the first inorganic encapsulation layer IL1 may be disposed on the via insulating layer VIA. The first inorganic encapsulation layer IL1 may cover the pixel defining layer PDL and the second electrode PE2. Examples of the material constituting the first inorganic encapsulation layer IL1 may include silicon oxide, silicon nitride, silicon oxynitride, and the like. These materials may be used alone or in combination.

The organic encapsulation layer OL may be disposed on the first inorganic encapsulation layer IL1 in the non-transmission area NTA and the transmission area TA. Since the first inorganic encapsulation layer IL1 is formed along a lower structure, an upper surface of the first inorganic encapsulation layer IL1 may not be flat. The organic encapsulation layer OL may have a relatively thick thickness compared to the first inorganic encapsulation layer IL1 and may have a flat upper surface through a planarization process. Accordingly, the display device 10 may prevent a gap defect from occurring when components (e.g., a touch sensing layer, a cover window, and the like) are disposed on the organic encapsulation layer OL. The organic encapsulation layer OL may have a substantially flat upper surface. Examples of the material constituting the organic encapsulation layer OL may include polyethylene terephthalate, polyethylene naphthalate, polycarbonate, polyimide, polyethylene sulfonate, polyoxymethylene, polyarylate, hexamethyldisiloxane, acrylic resin, and the like. These materials may be used alone or in combination.

The second inorganic encapsulation layer IL2 may be disposed on the organic encapsulation layer OL in the non-transmission area NTA and the transmission area TA. Examples of the material constituting the second inorganic encapsulation layer IL2 may include silicon oxide, silicon nitride, silicon oxynitride, and the like. These materials may be used alone or in combination. The first inorganic encapsulation layer IL1, the organic encapsulation layer OL, and the second inorganic encapsulation layer IL2 may prevent penetration of moisture, oxygen, or the like from the outside of the display device 10.

In the non-transmission area NTA and the transmission area TA, the first inorganic encapsulation layer IL1, the organic encapsulation layer OL, and the second inorganic encapsulation layer IL2 may constitute the encapsulation layer EL. The encapsulation layer EL may overlap the non-transmission area NTA and the transmission area TA. That is, the encapsulation layer EL may extend from the non-transmission area NTA to the transmission area TA.

Figure 5:
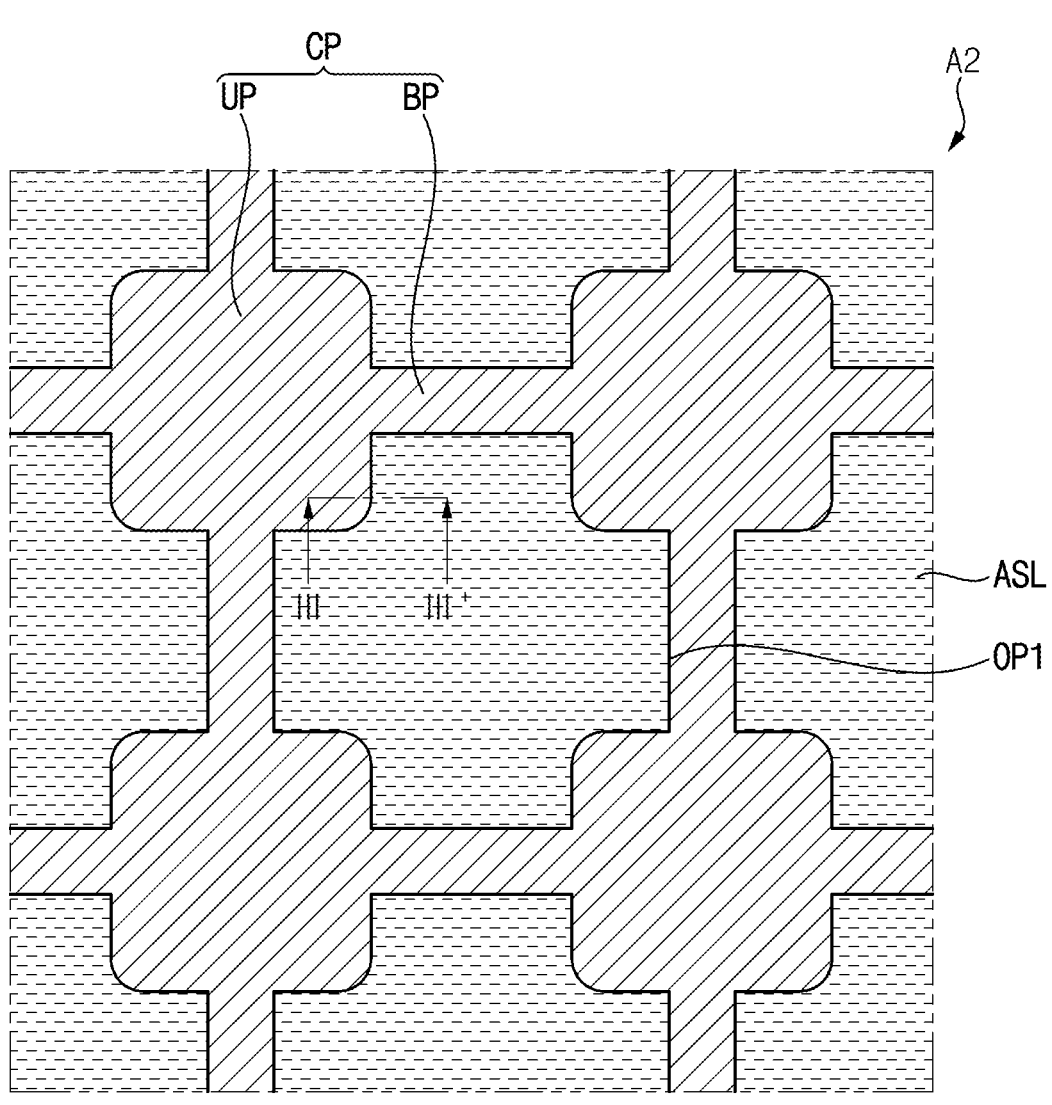
FIG. 5 is a plan view illustrating an example of a second area included in the display device of FIG. 1 according to an embodiment.
Figure 6:
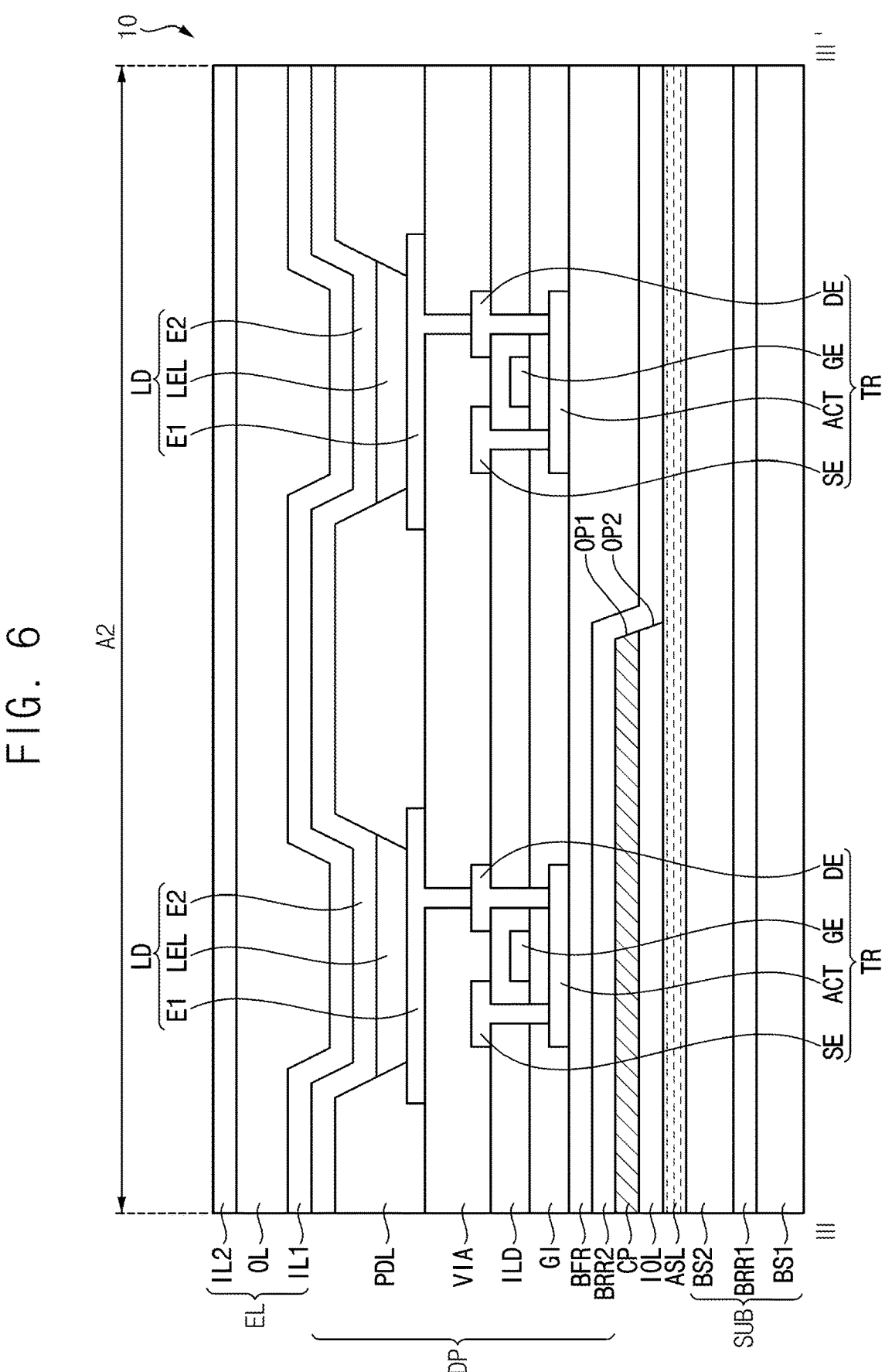
FIG. 6 is a cross-sectional view taken along line of FIG. 5.

FIG. 5 is a plan view illustrating an example of a second area included in the display device of FIG. 1 according to an embodiment. FIG. 6 is a cross-sectional view taken along line III-III' of FIG. 5.

Referring to FIGS. 5 and 6, the conductive layer CP may further overlap the second area A2 on the substrate SUB. Similarly, in the second area A2, the conductive layer CP may include a plurality of unit patterns UP and a plurality of bridge patterns BP connecting the unit patterns UP. The plurality of unit patterns UP may be arranged in various ways. For example, the plurality of unit patterns UP may be arranged in a matrix form. However, the conductive layer CP may have different shapes in the first area A1 and the second area A2.

The plurality of first openings OP1 defined in the conductive layer CP may further overlap a portion of the second area A2. That is, the conductive layer CP and the plurality of first openings OP1 may be disposed not only in the first area A1 but also in the second area A2.

In the second area A2, the inorganic layer IOL may overlap the conductive layer CP. The plurality of second openings OP2 defined in the inorganic layer IOL may further overlap a portion of the second area A2. That is, the inorganic layer IOL and the plurality of second openings OP2 may be disposed not only in the first area A1 but also in the second area A2.

In an embodiment, in the second area A2, the amorphous silicon layer ASL may entirely overlap the substrate SUB. That is, in the second area A2, the amorphous silicon layer ASL may be entirely disposed on the substrate SUB.

Accordingly, the plurality of third openings OP3 may be defined only in the amorphous silicon layer ASL disposed in the first area A1 and may not be defined in the second area A2. That is, in the second area A2, the plurality of first openings OP1 and the plurality of second openings OP2 may expose the amorphous silicon layer ASL.

In the second region A2, the amorphous silicon layer ASL may entirely overlap the conductive layer CP and the plurality of first openings OP1. In addition, the amorphous silicon layer ASL may entirely overlap the inorganic layer IOL and the plurality of second openings OP2.

In the second area A2, the display portion DP may be disposed on the conductive layer CP and the amorphous silicon layer ASL. That is, in the second area A2, the display portion DP may overlap the conductive layer CP, the plurality of first openings OP1, and the plurality of second openings OP2

Specifically, the second barrier layer BRR2 may be disposed on the conductive layer CP and the amorphous silicon layer ASL. The second barrier layer BRR2 may be entirely disposed on the first area A1 and the second area A2. The second barrier layer BRR2 may overlap the conductive layer CP and may be disposed on the conductive layer CP. The second barrier layer BRR2 may overlap the plurality of first openings OP1 and the plurality of second openings OP2 and may be disposed on the amorphous silicon layer ASL. However, the present disclosure is not limited thereto.

The transistor TR and the light emitting element LD may be disposed on the second barrier layer BRR2 and the buffer layer BFR. Accordingly, the transistor TR and the light emitting element LD may overlap the non-transmission area NTA of the first area Aland the second area A2.

In an embodiment, the inorganic layer IOL and the amorphous silicon layer ASL may be disposed under the conductive layer CP, and the amorphous silicon layer ASL may overlap only the transparent layer in the first area A1 and may overlap the entire substrate SUB in the second area A2. Accordingly, to prevent a user from seeing a ghost image or the like may be possible and the adhesive strength between the display portion DP and the substrate SUB may be improved. That is, since the amorphous silicon layer ASL overlaps only the transmission area TA in the first area A1, the transmittance of the first area A1 may be maintained. Since the amorphous silicon layer ASL is entirely disposed in the second area A2, the adhesive strength between the display portion DP and the substrate SUB in the second area A2 may be improved. Accordingly, the transmittance of the first area A1 of the display device 10 may be maintained, and the functionality of the functional module 200 of the display device 10 may be improved. In addition, the reliability of the display device 10 may be improved by reducing film lifting defect in the second area A2 through the amorphous silicon layer ASL.

Figure 7:
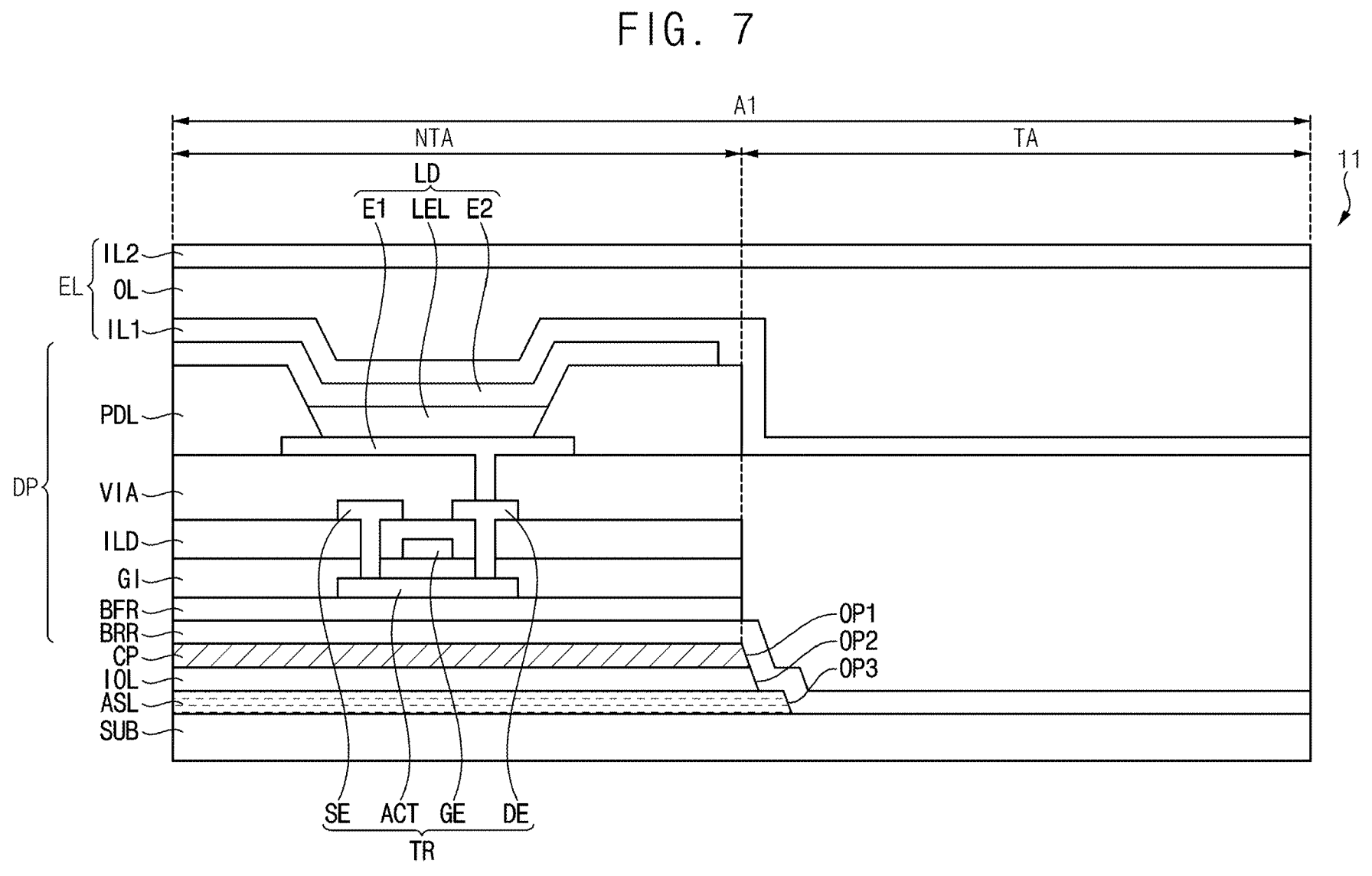

FIG. 7 is a cross-sectional view illustrating another example of FIG. 4.

Referring to FIG. 7, the substrate SUB of the display device 11 may be formed as a single layer. The substrate SUB may include a transparent material. The substrate SUB may include polyimide. For example, the substrate SUB may include transparent polyimide.

The amorphous silicon layer ASL, the inorganic layer IOL, and the conductive layer CP may be disposed on the substrate SUB, and the display portion DP may be disposed on the conductive layer CP.

In an embodiment, since the substrate SUB is formed as a single layer, a stacked structure in which polyimide and an inorganic material (e.g., silicon oxide, silicon nitride, silicon oxynitride, and the like) are alternately stacked may be simplified. Accordingly, film lifting defect due to weakening of the adhesive strength between the polyimide and the inorganic material may be reduced, and reliability of the display device 11 may be improved.

FIGS. 8, 9, 10, 11, 12, 13, 14, 15, 16, and 17 are views illustrating a method of manufacturing a display device according to an embodiment of the present disclosure.

For example, the method of manufacturing the display device described with reference to FIGS. 8, 9, 10, 11, 12, 13, 14, 15, 16, and 17 may be the manufacturing method of the display devices 10 and 11 described with reference to FIGS. 1, 2, 3, 4, 5, 6, and 7. Accordingly, redundant descriptions may be simplified or omitted.

Figure 8:
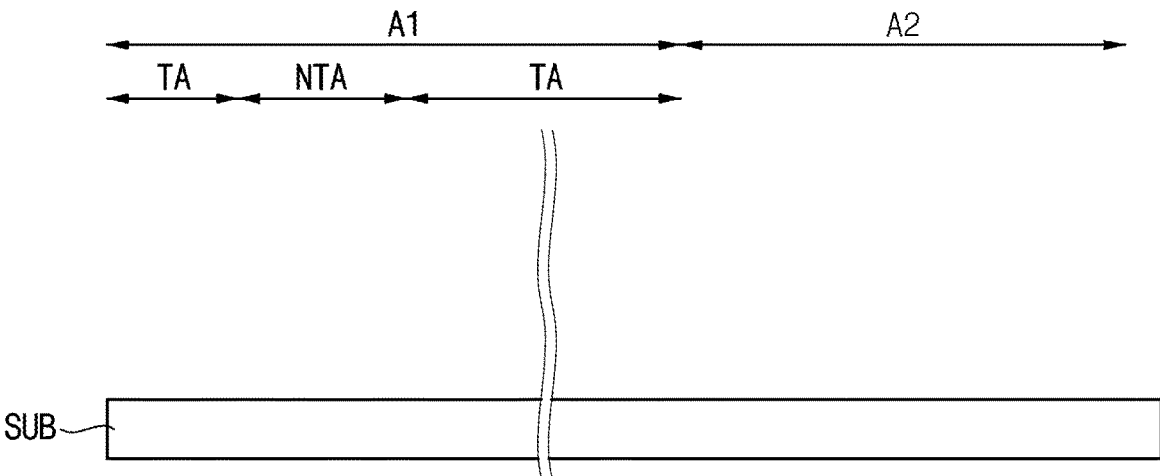
FIGS. 8, 9, 10, 11, 12, 13, 14, 15, 16, and 17 are views illustrating a method of manufacturing a display device according to an embodiment of the present disclosure.

Referring to FIG. 8, the substrate SUB may be formed. The substrate SUB may include the first area A1 and the second area A2. The first area A1 may be adjacent to the second area A2 and may include the transmission area TA and the non-transmission area NTA.

The substrate SUB may include polyimide and may be formed of a single layer or multiple layers. When the substrate SUB is formed in multiple layers, the substrate SUB may include a double-layered base substrate and a barrier layer (see FIG. 4).

Figure 9:
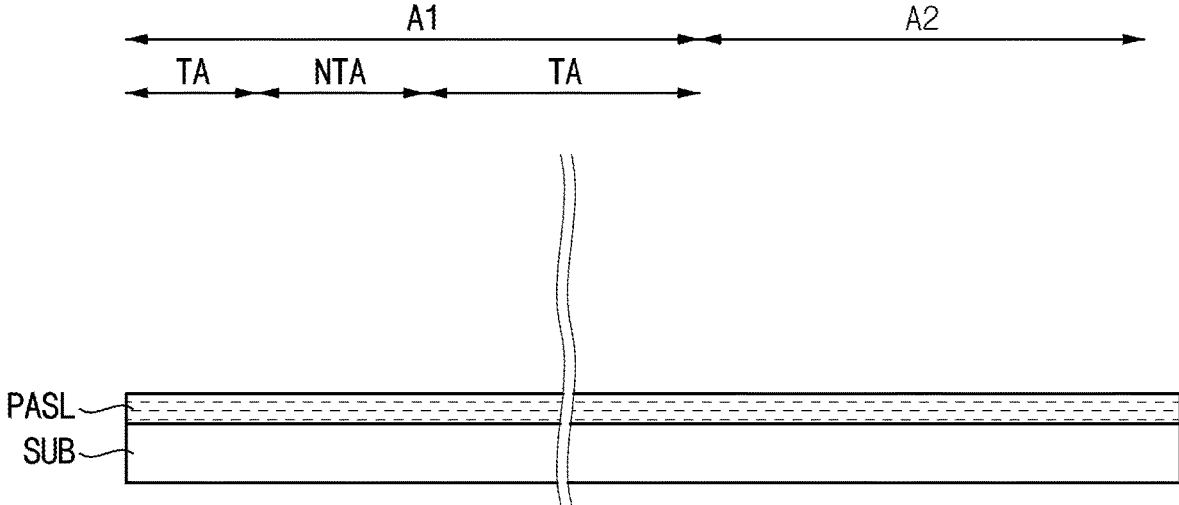

Referring further to FIG. 9, a preliminary amorphous silicon layer PASL may be formed in the first area A1 and the second area A2 on the substrate SUB. The preliminary amorphous silicon layer PASL may be formed of amorphous silicon.

Figure 10:
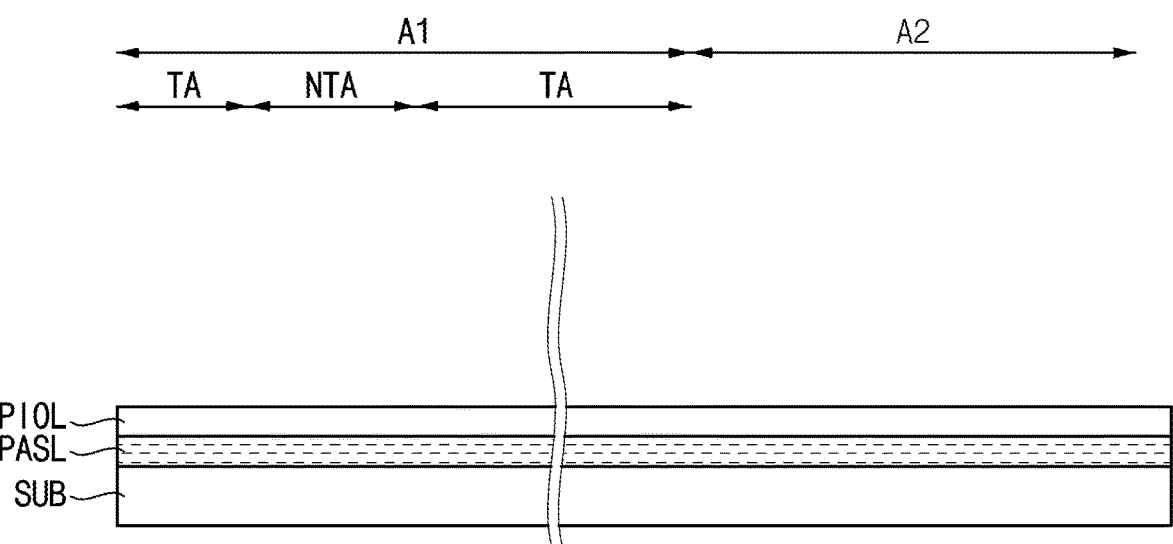

Further referring to FIG. 10, a preliminary inorganic layer PIOL may be formed in the first area A1 and the second area A2 on the preliminary amorphous silicon layer PASL. The preliminary inorganic layer PIOL may be formed of an inorganic material. For example, the preliminary inorganic layer PIOL may be formed of silicon oxide.

Figure 11:
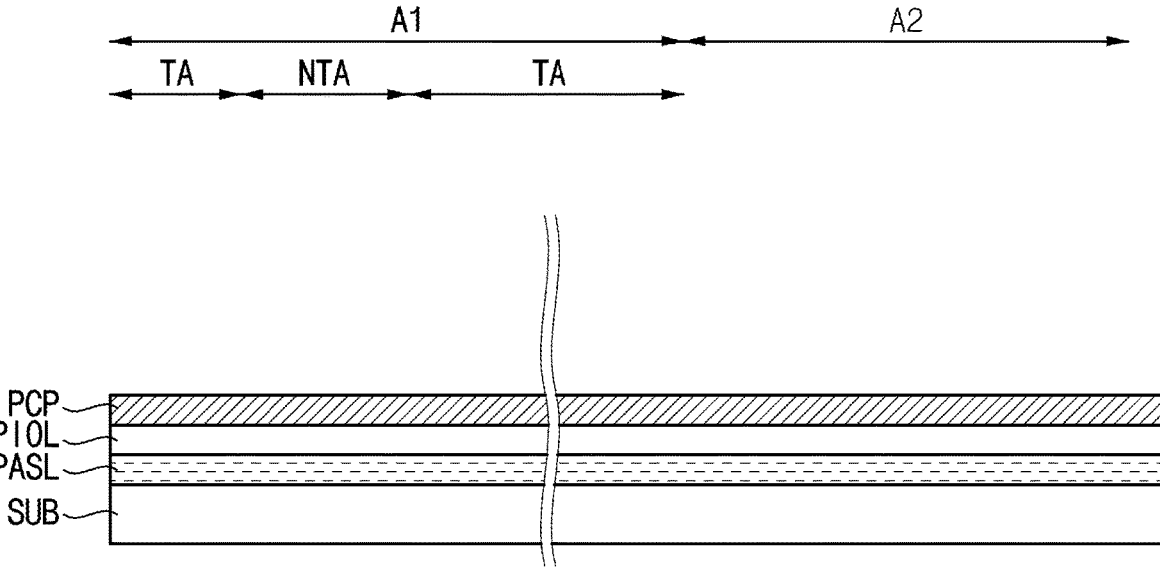

Further referring to FIG. 11, a preliminary conductive layer PCP may be formed in the first area A1 and the second area A2 on the preliminary inorganic layer PIOL. The preliminary conductive layer PCP may be formed of a conductive material. For example, the preliminary inorganic layer PIOL may be formed of molybdenum.

Figure 12:
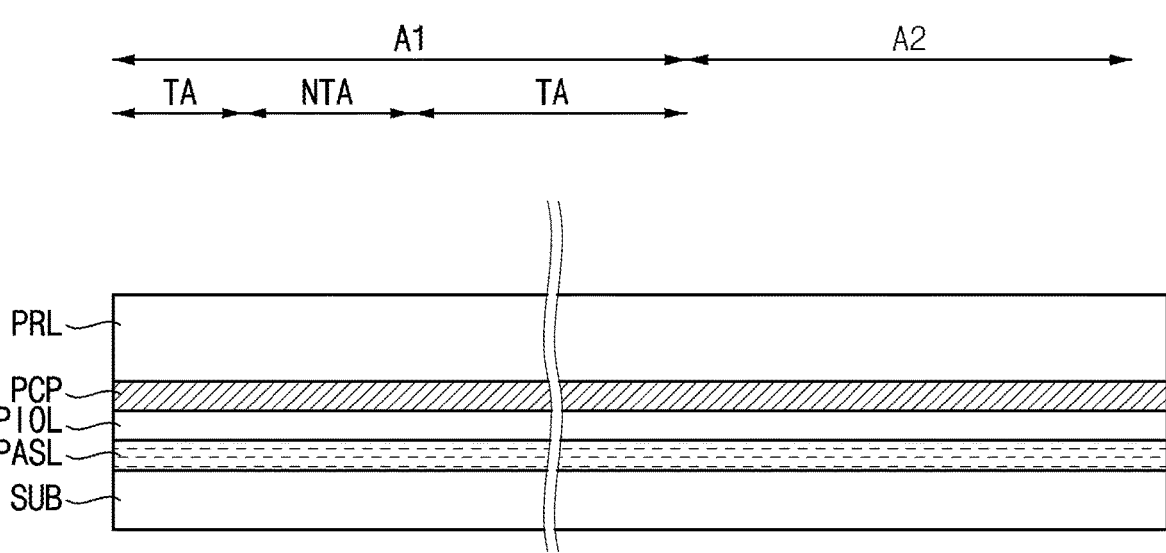

Further referring to FIG. 12, a photoresist layer PRL may be formed in the first area A1 and the second area A2 on the preliminary inorganic layer PIOL. The photoresist layer PRL may be formed of a photosensitive resin.

Figure 13:
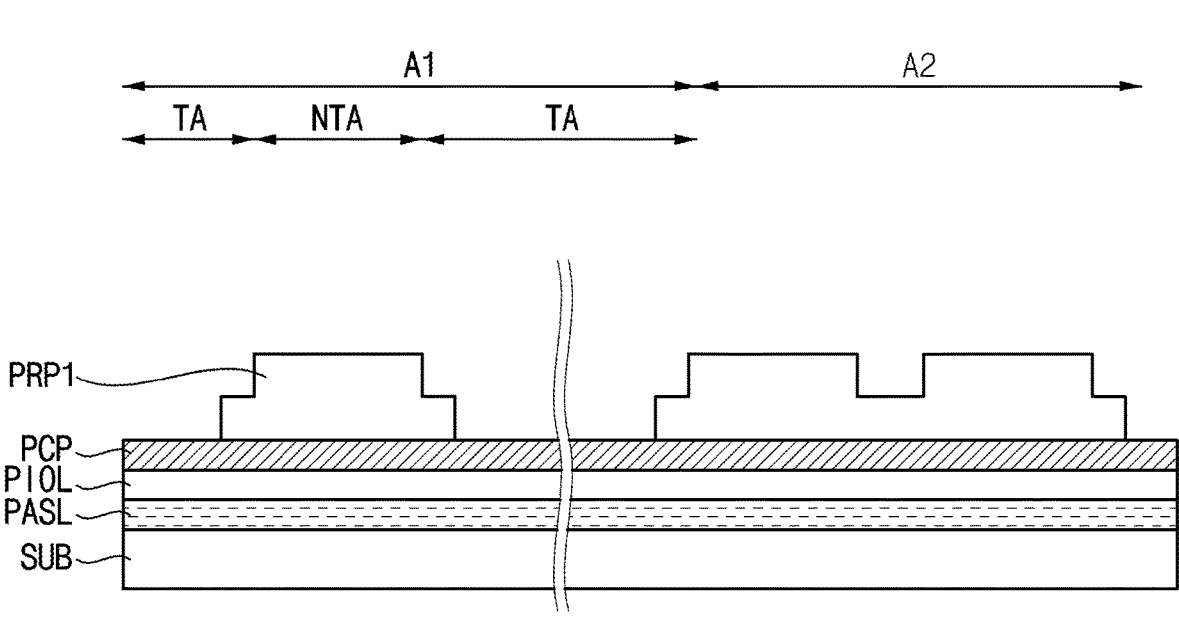

Further referring to FIG. 13, a first photoresist pattern PRP1 may be formed by patterning the photoresist layer PRL. The first photoresist pattern PRP1 may overlap the non-transmission area NTA of the first area A1 and the second area A2. The first photoresist pattern PRP1 may also overlap a portion of the transmission area TA.

In an embodiment, the first photoresist pattern PRP1 may be formed using a halftone mask. Accordingly, the first photoresist pattern PRP1 may include portions having different thicknesses. For example, in the first area A1, a thickness of a portion overlapping the non-transmission area NTA of the first photoresist pattern PRP1 may be greater than a thickness of a portion overlapping the transmission area TA.

Figure 14:
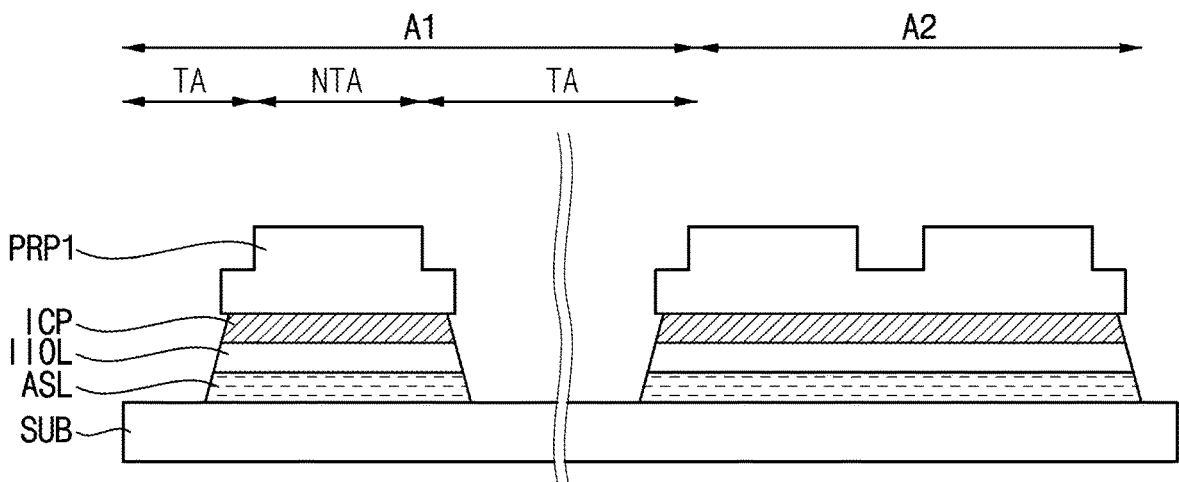
Figure 15:
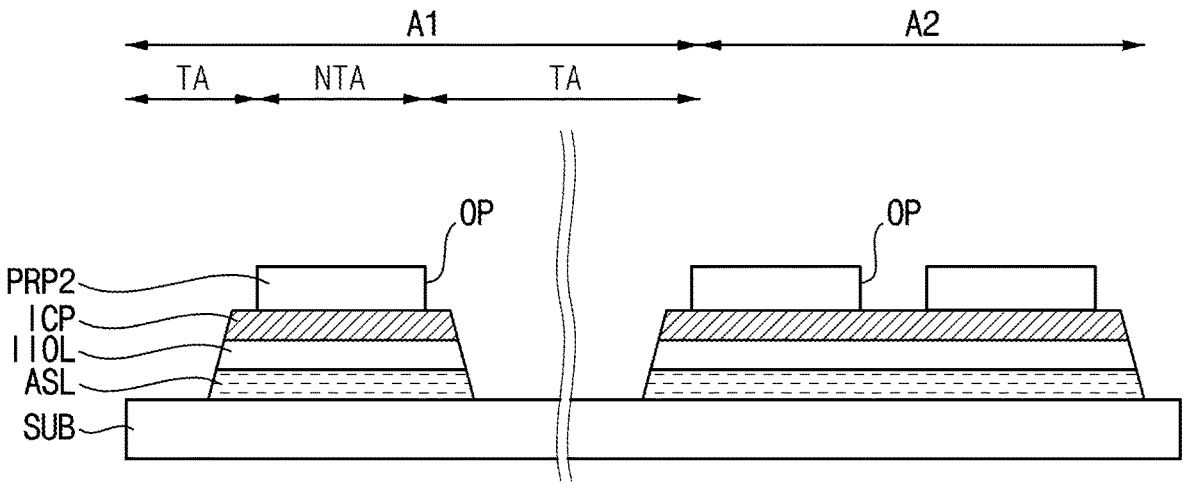
Figure 17:
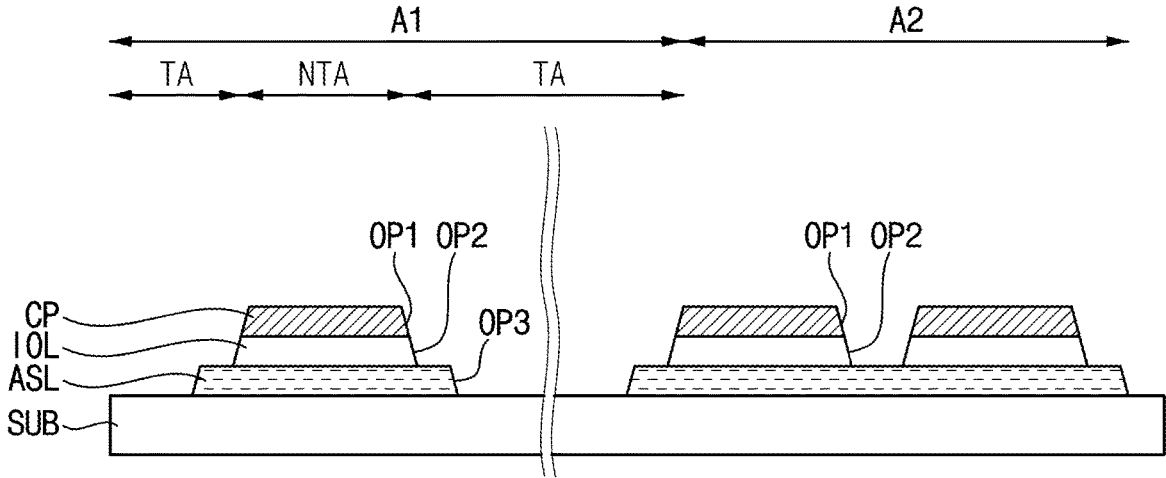

Further referring to FIGS. 14, 15, and 17, the conductive layer CP may be formed by patterning the preliminary conductive layer PCP, and the inorganic layer IOL may be formed by patterning the preliminary inorganic layer PIOL. The amorphous silicon layer ASL may be formed by patterning the amorphous silicon layer PASL.

Referring to FIG. 14, the preliminary conductive layer PCP, the preliminary inorganic layer PIOL, and the preliminary amorphous silicon layer PASL may be etched using the first photoresist pattern PRP1. In this case, the etching process may be performed as a dry etching process.

An intermediate conductive layer ICP may be formed by etching the preliminary conductive layer PCP, an intermediate inorganic layer IIOL may be formed by etching the preliminary inorganic layer PIOL, and the amorphous silicon layer ASL may be formed by etching the preliminary amorphous silicon layer PASL.

Referring to FIG. 15, a second photoresist pattern PRP2 may be formed by etching back the first photoresist pattern PRP1. The entire first photoresist pattern PRP1 may be etched through an etch-back process. Accordingly, a thin portion of the first photoresist pattern PRP1 may be removed. For example, a portion of the first photoresist pattern PRP1 overlapping the transmission area TA may be removed through the etch-back process, and a thickness of a portion of the first photoresist pattern PRP1 overlapping the non-transmission area NTA may be reduced.

The second photoresist pattern PRP2 may include a plurality of openings OP. The plurality of openings OP may overlap the transmission area TA of the first area A1 and a portion of the second area A2.

Figure 16:
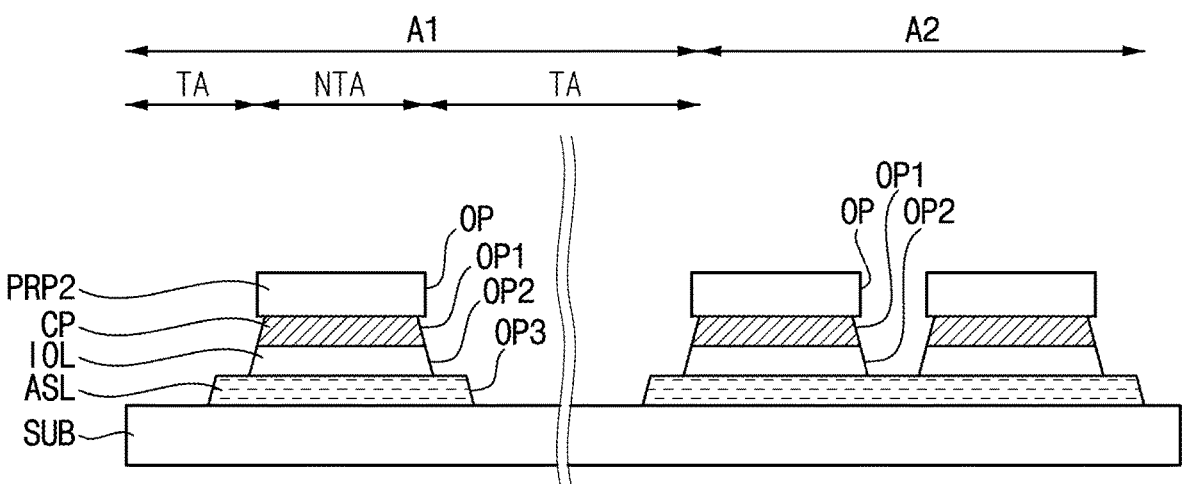

Further referring to FIG. 16, the intermediate conductive layer ICP and the intermediate inorganic layer IIOL may be etched using the second photoresist pattern PRP2. In this case, the etching process may be performed as a dry etching process.

In an embodiment, the conductive layer CP may be formed by etching the intermediate conductive layer ICP, and the inorganic layer IOL may be formed by etching the intermediate inorganic layer IIOL. In the etching process using the second photoresist pattern PRP2, the amorphous silicon layer ASL may not be etched.

A plurality of first openings OP1 overlapping the plurality of openings OP may be formed in the conductive layer CP. The plurality of first openings OP1 may overlap the transmission area TA and the second area A2 of the first area A1. Accordingly, the conductive layer CP may overlap the non-transmission area NTA and a portion of the second area A2.

In addition, a plurality of second openings OP2 overlapping the plurality of openings OP may be formed in the inorganic layer IOL. Accordingly, the plurality of second openings OP2 may overlap the plurality of first openings OP1, and the inorganic layer IOL may overlap the conductive layer CP. The plurality of second openings OP2 may overlap the transmission area TA of the first area A1 and the second area A2.

In the first area A1, in the etching process using the first photoresist pattern PRP1, a plurality of third openings OP3 overlapping the plurality of openings OP may be formed in the amorphous silicon layer ASL. However, in the etching process using the second photoresist pattern PRP2, the amorphous silicon layer ASL may not be etched. That is, in the second area A2, the plurality of first openings OP1 and the plurality of second openings OP2 may expose the amorphous silicon layer ASL. Accordingly, the amorphous silicon layer ASL may overlap the conductive layer CP in the first area A1 and entirely overlap the substrate SUB in the second area A2.

However, the present disclosure is not limited thereto, and the conductive layer CP and the amorphous silicon layer ASL may have the same area in the first area A1.

Referring to FIG. 17, the second photoresist pattern PRP2 may be removed. After the second photoresist pattern PRP2 is removed, a display portion (e.g., the display unit DP of FIG. 4) may be formed on the conductive layer CP and the substrate SUB. An encapsulation layer (e.g., the encapsulation layer EL of FIG. 4) may be formed on the display portion. Accordingly, a display device having different structures in the first area A1 and the second area A2 may be formed.

In an embodiment, since the first photoresist pattern PRP1 is formed using the halftone mask, a display device having different structures in the first area A1 and the second area A2 may be formed using only one photo process. Therefore, since an additional process is not required, efficiency in the manufacturing process of the display device may be improved.

The present disclosure can be applied to various display devices. For example, the present disclosure is applicable to various display devices such as display devices for vehicles, ships and aircraft, portable communication devices, display devices for exhibition or information transmission, medical display devices, and the like.

The foregoing is illustrative of embodiments and is not to be construed as limiting thereof. Although embodiments have been described, those skilled in the art will readily appreciate that many modifications are possible in the embodiments without materially departing from the novel teachings and advantages of the present inventive concept. Accordingly, all such modifications are intended to be included within the scope of the present inventive concept as defined in the claims. Therefore, it is to be understood that the foregoing is illustrative of various embodiments and is not to be construed as limited to the specific embodiments disclosed, and that modifications to the disclosed embodiments, as well as other embodiments, are intended to be included within the scope of the appended claims.

What is claimed is:

1. A display device comprising:
a substrate including a first area including a transmission area and a non-transmission area adjacent to the transmission area, and a second area adjacent to the first area;
a display portion disposed in the non-transmission area and the second area on the substrate;

a conductive layer disposed between the substrate and the display portion, and overlapping the non-transmission area and the second area;

an inorganic layer disposed on the substrate, disposed under the conductive layer, in contact with the conductive layer, and overlapping the conductive layer; and an amorphous silicon layer disposed on the substrate, disposed under the inorganic layer, in contact with the inorganic layer, overlapping the conductive layer in the first area, and entirely overlapping the substrate in the second area.

2. The display device of claim 1, wherein the conductive layer defines a plurality of first openings overlapping the transmission area of the first area and a portion of the second area.

3. The display device of claim 2, wherein the inorganic layer defines a plurality of second openings overlapping the plurality of first openings.

4. The display device of claim 3, wherein the amorphous silicon layer defines a plurality of third openings overlapping the plurality of first openings in the first area.

5. The display device of claim 4, wherein the amorphous silicon layer entirely overlaps the conductive layer and the plurality of first openings in the second area.

6. The display device of claim 4, wherein the plurality of first openings and the plurality of second openings extend to the amorphous silicon layer in the second area and the second area does not include the plurality of third openings.

7. The display device of claim 1, wherein the substrate includes transparent polyimide.

8. The display device of claim 1, wherein the inorganic layer includes silicon oxide.

9. The display device of claim 1, wherein the conductive layer includes:

a plurality of unit patterns arranged in a matrix form; and
a plurality of bridge patterns connecting the unit patterns.

10. The display device of claim 1, further comprising:

a functional module disposed under the substrate corresponding to the transmission area of the first area.

11. The display device of claim 1, wherein the display portion includes a light emitting element disposed on the conductive layer, wherein the light emitting element overlaps the non-transmission area and the second area, and is spaced apart from the transmission area.

12. A method of manufacturing a display device, the method comprising:

providing a substrate including a first area including a transmission area and a non-transmission area adjacent to the transmission area, and a second area adjacent to the first area;

forming a preliminary amorphous silicon layer on the substrate;

forming a preliminary inorganic layer on the preliminary amorphous silicon layer;

forming a preliminary conductive layer on the preliminary inorganic layer;

forming a conductive layer overlapping the non-transmission area and the second area by patterning the preliminary conductive layer;

forming an inorganic layer overlapping the conductive layer by patterning preliminary inorganic layer; and forming an amorphous silicon layer overlapping the conductive layer in the first area and entirely overlapping the substrate in the second area by pattering the preliminary amorphous silicon layer.

13. The method of claim 12, further comprising:

forming a photoresist layer on the preliminary conductive layer;

forming a first photoresist pattern by patterning the photoresist layer; and forming a second photoresist pattern by etch-backing the first photoresist pattern.

14. The method of claim 13, wherein the first photoresist pattern is formed using a halftone mask.

15. The method of claim 13, wherein the first photoresist pattern overlaps the non-transmission area of the first area and the second area.

16. The method of claim 15, wherein each of the preliminary conductive layer, the preliminary inorganic layer, and the preliminary amorphous silicon layer is etched using the first photoresist pattern to form an intermediate conductive layer, an intermediate inorganic layer, and the amorphous silicon layer.

17. The method of claim 16, wherein the second photoresist pattern includes a plurality of openings overlapping the transparent area of the first area and a portion of the second area.

18. The method of claim 17, wherein each of the intermediate conductive layer and the intermediate inorganic layer is etched using the second photoresist pattern to form the conductive layer and the inorganic layer.

19. The method of claim 18, wherein a plurality of first openings overlapping the plurality of openings are formed in the conductive layer, and a plurality of second openings overlapping the plurality of openings are formed in the inorganic layer.

20. The method of claim 19, wherein the plurality of first openings and the plurality of second openings expose the amorphous silicon layer in the second area.

* * * * *